(12) United States Patent
Assaderaghi et al.

(10) Patent No.: US 6,686,629 B1
(45) Date of Patent: Feb. 3, 2004

(54) SOI MOSFETS EXHIBITING REDUCED FLOATING-BODY EFFECTS

(75) Inventors: Fariborz Assaderaghi, Mahopac, NY (US); Werner Rausch, Stormville, NY (US); Dominic Joseph Schepis, Wappingers Falls, NY (US); Ghavam G. Shahidi, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/377,331

(22) Filed: Aug. 18, 1999

(51) Int. Cl.$^7$ ............................................... H01L 29/76
(52) U.S. Cl. ...................... 257/347; 254/344; 254/347; 254/348; 254/345; 254/350; 254/359
(58) Field of Search ................................ 257/347, 350, 257/359, 344, 345

(56) References Cited

U.S. PATENT DOCUMENTS

| | | | | |
|---|---|---|---|---|
| 4,722,909 A | * | 2/1988 | Parrillo et al. .................. 437/34 |
| 4,984,043 A | | 1/1991 | Vinal ....................... 357/23.14 |
| 5,151,759 A | | 9/1992 | Vinal ........................ 357/23.3 |
| 5,185,280 A | | 2/1993 | Houston et al. .............. 437/44 |
| 5,225,357 A | * | 7/1993 | Ho ................................ 432/30 |
| 5,244,823 A | * | 9/1993 | Adan .......................... 437/41 |
| 5,364,807 A | | 11/1994 | Hwang ........................ 437/44 |
| 5,409,848 A | | 4/1995 | Han et al. ..................... 437/35 |
| 5,422,506 A | | 6/1995 | Zamapian ................... 257/344 |
| 5,536,962 A | | 7/1996 | Pfiester ....................... 257/392 |
| 5,585,285 A | | 12/1996 | Tang ............................ 437/21 |
| 5,757,045 A | * | 5/1998 | Tsai et al. .................... 257/336 |
| 5,767,557 A | * | 6/1998 | Kizilyalli ..................... 257/403 |
| 5,793,090 A | * | 8/1998 | Gardner et al. ............. 257/408 |
| 5,821,147 A | * | 10/1998 | Kizilyalli ..................... 438/305 |
| 5,923,987 A | * | 7/1999 | Burr .............................. 438/304 |
| 5,936,278 A | * | 8/1999 | Hu et al. ..................... 257/336 |
| 6,031,261 A | * | 2/2000 | Kang ........................... 257/302 |
| 6,046,478 A | | 4/2000 | Klein ........................... 257/350 |
| 6,127,222 A | * | 10/2000 | Luning et al. .............. 438/257 |
| 6,130,457 A | * | 10/2000 | Yu et al. ....................... 257/347 |
| 6,133,610 A | * | 10/2000 | Bolam et al. ............... 257/349 |
| 6,204,138 B1 | * | 3/2001 | Krishnan et al. ........... 438/307 |
| 6,268,640 B1 | * | 7/2001 | Park et al. ................... 257/607 |
| 6,271,095 B1 | * | 8/2001 | Yu ............................... 438/302 |
| 6,353,245 B1 | * | 3/2002 | Unnikrishnan .............. 257/347 |
| 6,368,928 B1 | * | 4/2002 | Wang et al. ................. 438/307 |
| 6,472,282 B1 | * | 10/2002 | Yu ............................... 438/305 |

OTHER PUBLICATIONS

Kamgar et al, Ultra–High Speed CMOS Circuits in Thin SIMOX Films, *IEDM*, 1989, 829–832.
Shahidi et al, Fabrication of CMOS on Ultrathin SOI Obtained by Epitaxial Lateral Overgrowth and Chemical–Mechanical Polishing, *IEDM*, 1990, 587–590.

* cited by examiner

*Primary Examiner*—Jerome Jackson
*Assistant Examiner*—Edgardo Ortiz
(74) *Attorney, Agent, or Firm*—Connolly, Bove, Lodge & Hutz LLP

(57) ABSTRACT

Disadvantages of the floating body of a SOI MOSFET are addressed by providing a pocket halo implant of indium beneath the gate and in the channel region of the semiconductor SOI layer of the MOSFET. Also provided is the method for fabricating the device.

16 Claims, 5 Drawing Sheets

FIG. I

SOI MOSFETS EXHIBITING REDUCED FLOATING-BODY EFFECTS

TECHNICAL FIELD

The present invention relates to a thin film silicon-on-insulator semiconductor device, and more particularly a SOI MOSFET that exhibits reduced floating-body adverse effects. The semiconductor device of the present invention includes a pocket halo implant of indium beneath the gate and in the channel region of the semiconductor SOI layer of the device. Furthermore, the present invention relates to a process for fabricating the SOI MOSFET devices of the present invention.

BACKGROUND OF INVENTION

Field effect transistors (FETs) have become the dominant active device for very large scale integration (VLSI) and ultra large scale integration (ULSI) applications in view of the high impedance, high density and low power characteristics of integrated circuit FETs. In fact, much research and development has involved improving the speed and density of FETs and on lowering their power consumption.

The most common configuration of FET devices is the MOSFET which typically comprises source and drain regions in a semiconductor substrate at a first surface thereof, and a gate region therebetween. The gate includes an insulator on the first substrate surface between the source and drain regions, with a gate electrode or contact on the insulator. A channel is present in the semiconductor substrate beneath the gate electrode, and the channel current is controlled by a voltage at the gate electrode.

More recently, in an effort to improve the performance of FET devices such as the threshold voltage and avoiding breakdown of short channel devices, silicon-on-insulator (SOI) technology has become an increasingly important technique. SOI technology deals with the formation of transistors in a relatively thin monocrystalline semiconductor layer which overlies an insulating layer. The insulating layer is typically formed on an underlying substrate which may be silicon. In other words, the active devices are formed in a thin semiconductor on insulator layer rather than in the bulk semiconductor of the device. Currently, silicon is most often used for the monocrystalline semiconductor layer in which devices are formed. However, it will be understood by those skilled in the art that other monocrystalline layers such as germanium or gallium arsenide may be used. Accordingly, any subsequent references to silicon will be understood to include any semiconductor material.

High performance and high density integrated circuits are achievable by using the SOI technology because of the reduction of parasitic elements present in integrated circuits formed in bulk semiconductor. For example, for a MOS transistor formed in bulk, parasitic capacitance is present at the junction between the source/drain regions and the underlying substrate, and the possibility of breakdown of the junction between source/drain regions and the substrate regions also exist. A further example of parasitic elements is present for CMOS technology in bulk, where parasitic bipolar transistors formed by n-channel and p-channel transistors in adjacent wells can give rise to latch-up problems. Since SOI structures significantly alleviate parasitic elements, and increase the junction breakdown tolerance of the structure, the SOI technology is well suited for high performance and high density integrated circuits.

The first application of SOI technology was silicon-on-sapphire. Most recent efforts have been directed toward growing monocrystalline silicon on top of a silicon dioxide layer grown on a silicon wafer. See for example the publications entitled "Ultra-High Speed CMOS Circuits in Thin Simox Films" by Camgar et al, Vol. 89, *IEDM*, pp. 829–832 (1989) and "Fabrication of CMOS on Ultra Thin SOI Obtained by Epitaxial Lateral Overgrowth and Chemical-Mechanical Polishing", Shahidi et al, Vol. 90, *IEDM*, pp. 587–590 (1990).

Furthermore, SOI technology allows for the mapping of standard advanced technologies into a SOI technology without significant modifications. SOI process techniques include epitaxial lateral overgrowth (ELO), lateral solid-phase epitaxy (LSPE) and full isolation by porous oxidized silicon (FIPOS). SOI networks can be constructed using the semiconductor process of techniques of separation by implanted oxygen (SIMOX) and wafer-bonding and etch-back (SIBOND) because they achieve low defect density, thin film control, good minority carrier lifetimes and good channel mobility characteristics. Structural features are defined by shallow-trench isolation (STI). Shallow-trench isolation eliminates planarity concerns and multidimensional oxidation effects, such as LOCOS bird's beak, thereby allowing technology migration and scaling to sub-0.25 $\mu$ technologies.

Although the floating body of a SOI MOSFET provides a number of advantages, including the absence of the reverse-body effect, there are some other problems that such structure poses. Included among the more important problems caused by the device floating body are reduction of the standard saturated threshold voltage, increase of the device OFF current, the pass-transistor leakage current, and large fluctuations in the linear threshold voltage of the device. Accordingly, it would be desirable to reduce the adverse effects of the floating body of SOI devices. The floating-body effects are normally more severe in NMOS devices than in PMOS devices, due to a higher impact ionization rate and normally higher parasitic bipolar gain.

SUMMARY OF INVENTION

The present invention provides for significantly reducing the floating-body problems of SOI devices. In particular, according to the present invention, indium is implanted into the device to provide a pocket halo implant for controlling the short-channel effect and the drain-induced barrier lowering (DIBL). In addition, the indium implant employed according to the present invention degrades the forward characteristics of the body-source diode. In other words, the body-source diode becomes leakier. This higher forward junction leakage in turn reduces the floating-body effects substantially.

More particularly, the present invention is concerned with a thin film silicon-on-insulator semiconductor device which comprises a buried insulation layer located above the layer of the semiconductor material, a semiconductor SOI layer of a first conductivity type located above the buried insulating layer, gate insulating layer located above selected portions of the semiconductor SOI layer, and gate conductor located above the gate insulating layer, source and drain regions of a second conductivity type opposite from the first conductivity type of the semiconductor SOI layer, shallow source and drain extensions of the second conductivity type and pocket halo implant beneath the gate in the channel region of the semiconductor SOI layer, wherein the pocket halo implant is indium implanted at a dosage of about 5E13 to about 1.5E14 and at an energy level of about 60 to about 125 Kev.

Another aspect of the present invention relates to a method for fabricating a thin film silicon-on-insulator semiconductor device. The method comprises providing a structure having a buried insulation layer located above the layer of semiconductor material, semiconductor SOI layer of a first conductivity type located above the buried insulating layer, gate insulating layer located above selected portions of the semiconductor SOI layer, and gate conductor located above the gate insulating layer, shallow source and drain extensions of a second conductivity type opposite from the first conductivity type of the semiconductor SOI layer, and implanting indium ions at a dosage of about 5E13 to about 1.5E14 at an energy level of about 60 to about 125 Kev and at an angle $\alpha$ of about 0° to about 45°, and then annealing the structure at a temperature of about 900° C. to about 1025° C. for about 5 to about 25 seconds to thereby provide a pocket halo implant beneath the gate and in the channel region of the semiconductor SOI layer. The source and drain regions of the second conductivity type are then provided.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures. For convenience, when the discussion of the fabrication steps of the present invention refer to a particular type of substrate and/or particular type of dopant impurities, it is understood that the present invention is applicable to the opposite type without departing from the spirit of the present invention. For instance, when reference is made to a p-type silicon substrate as the semiconductor substrate, and n-type impurities as diffused or implanted dopant impurities, it is understood that an n-type substrate and p-type diffused or implanted dopant impurities are likewise suitable. In addition, it is understood that when the discussion refers to n-type impurities, the process steps are applicable to p-type impurities and vice versa. Also, when reference is made to impurities of a "first type" and to impurities of a "second type", it is understood that the "first type" refers to n- or p-type impurities and "second type" refers to the opposite conductivity type. That is, if the "first type" is p, then the "second type" is n. If the "first type" is n, then the "second type" is p.

Also, the present invention is applicable to substrates other than silicon as known in the art. Moreover, the terms "polysilicon" and "polycrystalline silicon" are used herein interchangeably as in the prior art.

Figure 1:
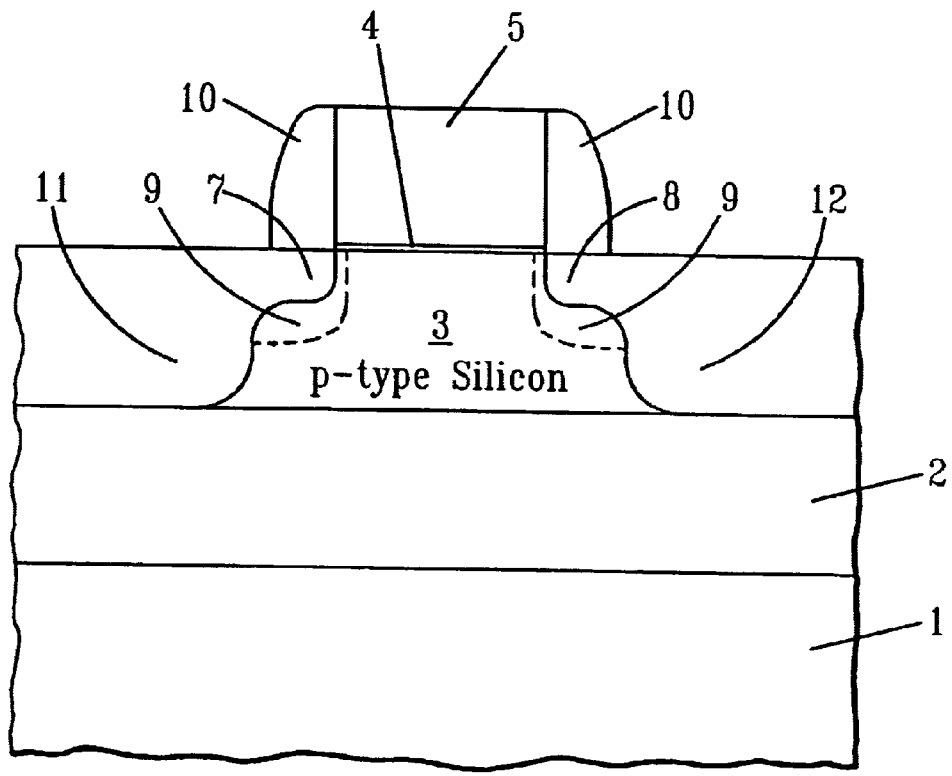
FIG. 1 is a schematic cross-section of a MOSFET SOI device according to the present invention.

FIG. 1 illustrates providing a bulk semiconductor substrate 1 such as a silicon substrate having <100> crystal structure. An insulating layer 2 is provided on the bulk semiconductor substrate 1. Examples of suitable insulating layers include silicon dioxide and silicon nitride. An oxide layer can be grown on the silicon substrate 1 by a thermal oxidation process or by chemical vapor deposition of silicon dioxide such as using a gas mixture of $CO_2/SiH_4/N_2$ or $N_2O/SiH_4/N_2$ at temperatures of about 800° C. to about 1100° C. The insulation layer 2 can be referred to as the buried insulation layer.

Next, a top semiconductor substrate material 3 such as silicon can be provided above the insulation layer 2. For instance, a silicon layer 3 can be grown by a gas-solid or heterogeneous reaction system. In particular, such reaction system desirably includes hydrogen, silicon and chlorine, a typical system being a combination of $SiCl_4$—$H_2$ as disclosed by Silvesteri and Tang, "Reproducible Technique for Simultaneous Deposition of Polysilicon on Oxide-Silicon", *IBM Technical Disclosure Bulletin*, Vol. 23, No. 2, July 1980, pp. 810–820, disclosure of which is incorporated herein by reference. The silicon layer 3 can be doped either in n-type or p-type, depending on the desired structure. The doping can be carried out by ion implantation or thermal diffusion. P-type dopants for silicon include boron. N-type dopants for silicon include phosphorus and arsenic. FIG. 1 illustrates p-doping.

Next, a dielectric layer 4 is formed on the top semiconductor substrate layer 3 along with active devices which in the case of FIG. 1 is a gate 5. The gate can be provided, for instance, by depositing a layer of polycrystalline silicon by chemical vapor deposition followed by doping such as with an n-type dopant such as arsenic, phosphorus or antimony by any one of several techniques. A thick additional layer of silicon dioxide can be deposited on the polysilicon, such as by chemical vapor deposition. This serves as an etching mask to help delineate the polycrystalline material. The gate 5 can be delineated by well known techniques. For instance, a gate pattern determining layer such as a layer of resist material (not shown) of the type employed in known lithographic masking and etching techniques can be placed over the surface of the oxide. Any of the well known photosensitive polymerizable resist materials known in the art may be used. The resist material can be applied such as by spinning on or by spraying.

After the layer of resist material is applied, it can then be selectively exposed to ultraviolet radiation using a photolithographic mask. The mask would have transparent material having opaque portions in a predetermined pattern to define the gate. The mask wafer is then subjected to ultraviolet light which polymerizes the portion of the resist material underlying the transparent regions of the mask. The unexposed photoresist material and uncovered portions of the silicon dioxide are then removed, followed by removal of those portions of the polysilicon except for the desired gate region. The portions of dielectric layer 4 uncovered by removal of portions of polysilicon 5 are then removed. Next, the remaining portions of the photoresist material and silicon dioxide material above the gate region is removed.

Lightly doped source/drain regions 7, 8 are provided by ion implantation of N-type dopant. Typically, the n-type dopant is implanted at a dosage of about 6E14 to about 9E14, preferably at a dosage of about 7E14 to about 8E14, and typically at an energy level of about 10 to about 15 Kev, and preferably at an energy level of about 12 to about 13 Kev.

Next, indium is implanted at a dosage of about 5E13 to about 1.5E14 and energy of about 60 to about 125 Kev. The indium is implanted at an angle α of 0° to about 45°. After the implantation, the structure is then thermally annealed at a temperature of about 900 to about 1025° C. for about 5 to about 25 seconds. This creates pocket halo implant as shown in FIG. 1 which forms a junction in combination with the shallow source/drain extension that is located between the deep source/drain junctions and is designed to provide a particular concentration at both the gate oxide/silicon interface and at the intersection of the shallow source/drain extension regions with the pocket implant.

The implant and anneal conditions are selected to provide a peak active dopant concentration of about $8 \times 10^{18}$ atoms/$cm^3$ to about $2 \times 10^{19}$ atoms/$cm^3$ at this junction. This relatively high concentration in conjunction with the presence of residual dislocations results in the proper combination of forward bias junction leakage at low bias and reverse bias leakage at the power supply voltage. For instance, if too many defects are left behind, the junction reverse body leakage will be too high, increasing and impacting the device off current. If the defects are completely removed, then the forward leakage of the junction will be low and it will not clamp the body voltage to low values. Therefore, it will be ineffective in reducing floating body effects.

The peak concentration occurs below the side wall spacer or the gate polycrystalline silicon in a high performance MOSFET device which is fabricated using a pocket implant. Since the dopant concentrations in this region of the device are determined by lateral scattering of the implanted dopant ions and lateral diffusion during annealing, accurate determination of the peak junction concentration requires 2-dimensional implants/diffusions simulations and/or indirect measurements of the lateral doping profiles.

The junction doping concentration achieved by the present invention which results in reducing the floating body effects also effect other electrical characteristics of the device such as the threshold voltage at very short channel lengths and the junction capacitance.

Figure 2:
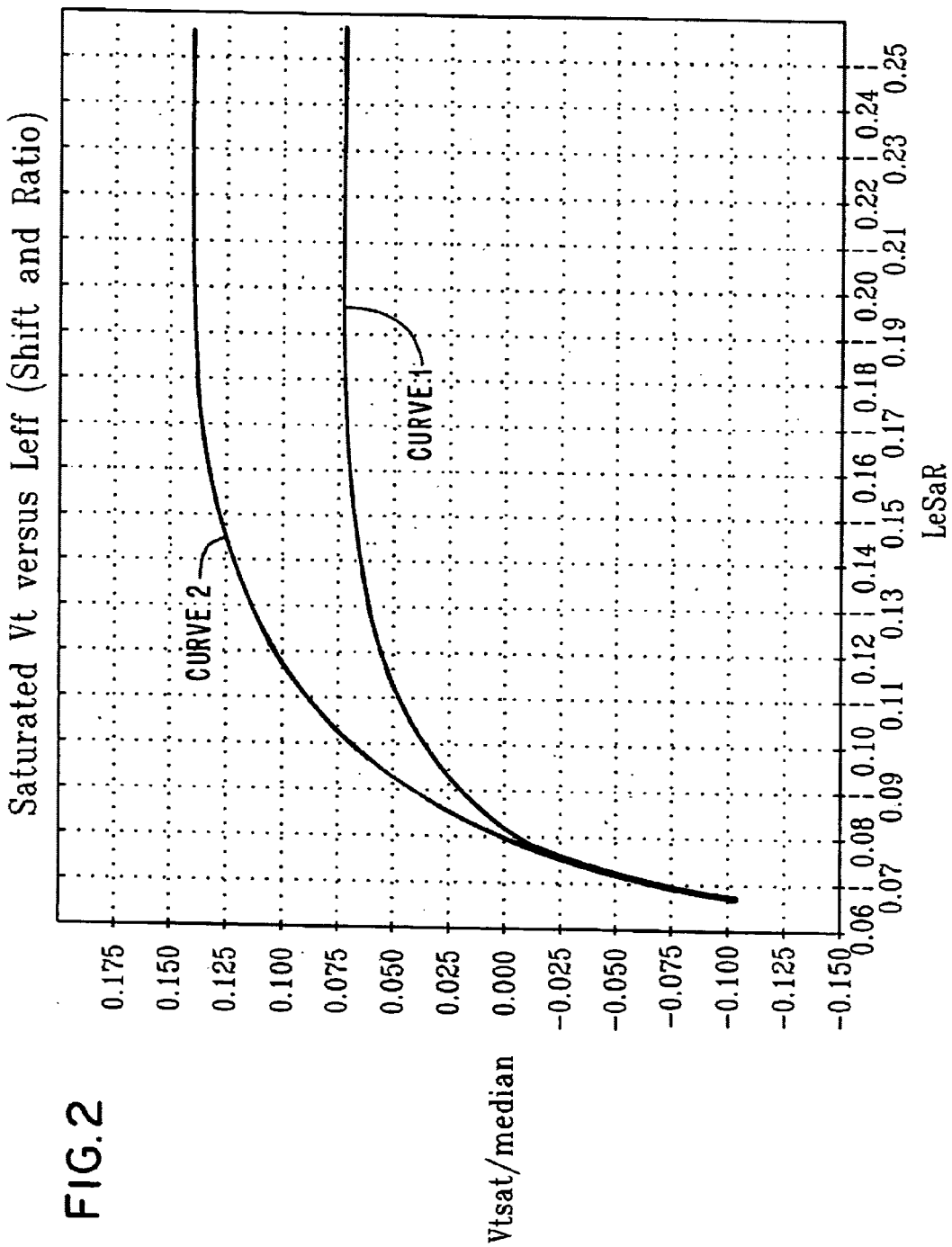
FIG. 2 is a graph illustrating threshold-voltage achieved by the present invention as compared to prior art process.

The higher forward current of the body-source diode means that the body voltage will always "clamp" to lower values than that of a conventional SOI MOSFET. Therefore, the threshold-voltage reduction observed in MOSFET devices at high drain biases will be greatly suppressed. Along these lines, see FIG. 2 where curve 1 represents prior art device not containing the indium implant according to the present invention and curve 2 represents the present invention. As noted, the device according to the present invention illustrates a higher saturated $V_t$ as compared to prior art.

Figure 3:
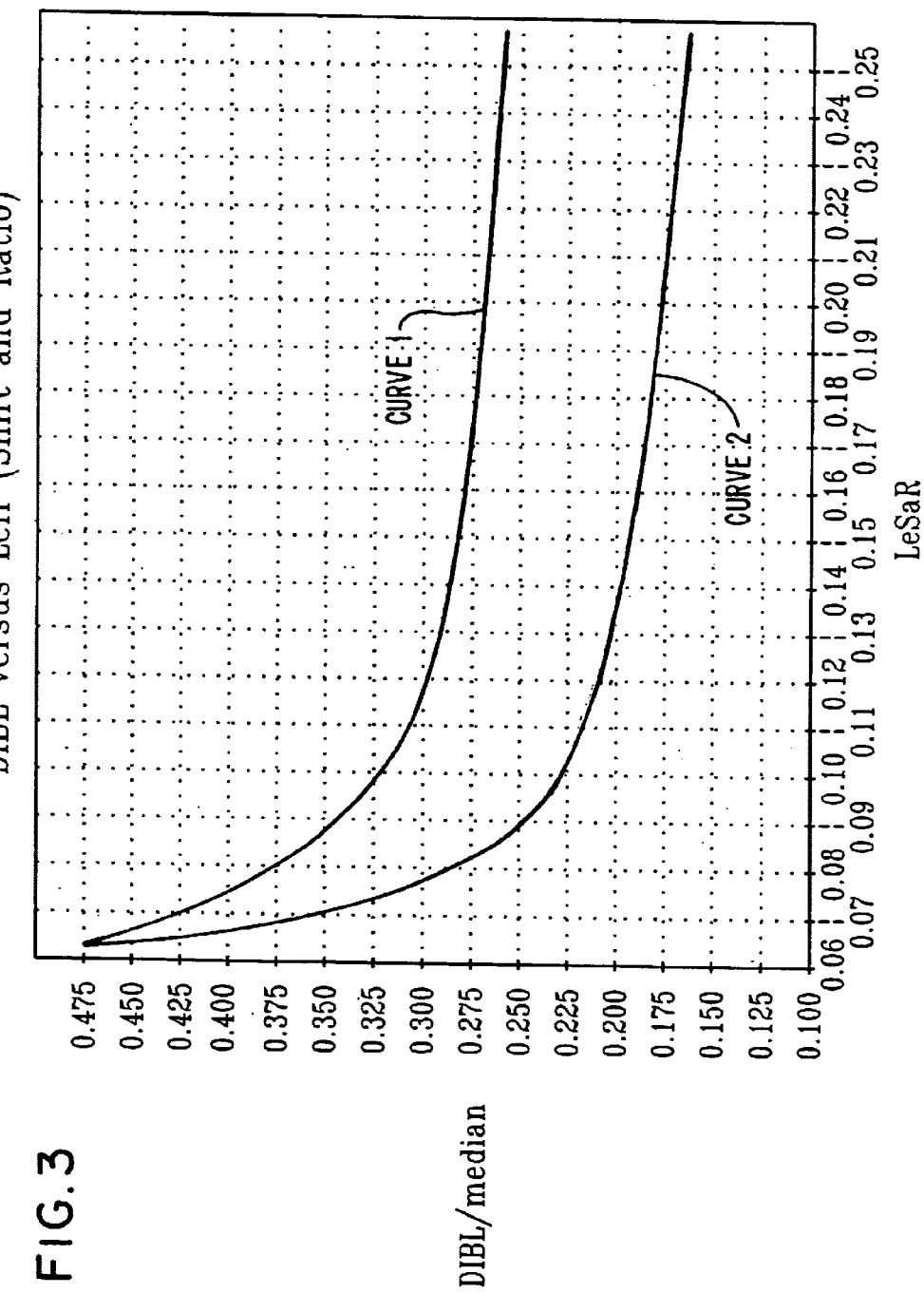
FIG. 3 illustrates the effect on drain-induced barrier lowering (DIBL) as achieved by the present invention.

In addition, the present invention provides for a lower apparent drain-induced barrier lowering (DIBL) and therefore a lower off current (for a given linear threshold voltage). This is illustrated in FIG. 3 where curve 1 illustrates prior art device without the indium implant according to the present invention and curve 2 illustrates the results achieved from the present invention.

Figure 4:
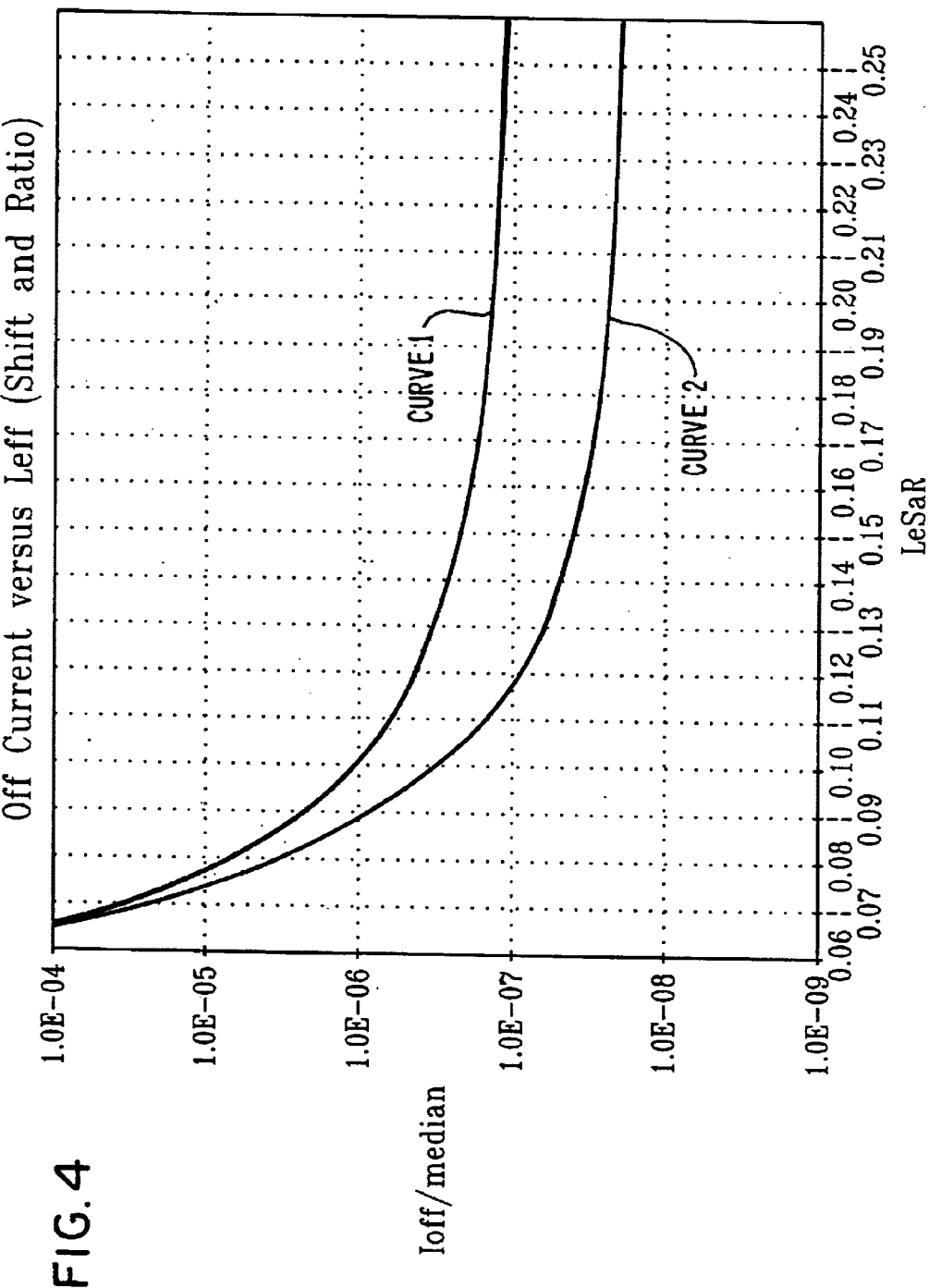
FIG. 4 illustrates the effect on off current as achieved by the present invention.

In addition, the past-transistor leakage current will be substantially reduced as illustrated in FIG. 4 where curve 1 illustrates the results from prior art device not including the indium implant as compared to the present invention results shown in curve 2. It is believed that this effect is due to the fact that during the transient source lowering, the body-to-source voltage will be smaller than in conventional devices. Since this body-to-source voltage essentially constitutes the Vbe of parasitic bipolar device, its reduction directly suppresses the past-gate leakage current.

Figure 5:
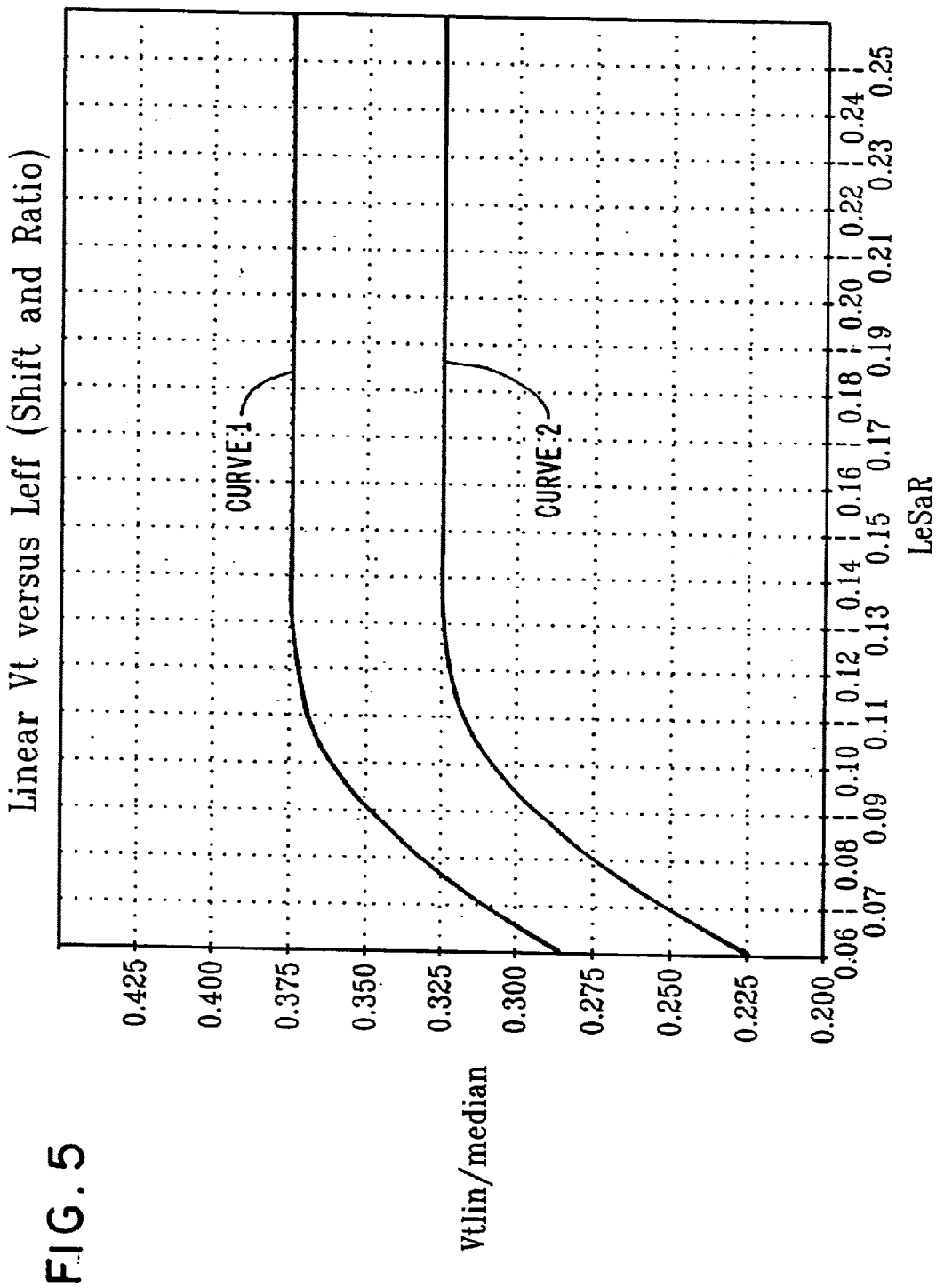
FIG. 5 illustrates the effect of linear threshold voltage and off current according to the present invention.

Furthermore, the "leaky" body-source diode created by the indium implant according to the present invention minimizes fluctuations (spread) of linear threshold voltage and off current of the SOI devices. In fact, usually the spread of these parameters are larger in SOI devices than in bulk devices. The cause of this anomaly is due to the floating body, and fluctuation of its residual potential. A leaker body-source diode pins the body potential more effectively, thereby reducing its variation. This results in a tighter distribution of these parameters as demonstrated by FIG. 5 where the points for curve 1 represent the prior art device not containing the indium implant and curve 2 represents the present invention.

In addition, gate sidewall isolation 10 can be provided as known in the art, followed by providing more heavily doped source/drain regions 11, 12. The more heavily doped source/drain regions can be provided, for instance, by ion implanting of n-type dopant typically at a dose of about 3E15 to about 7E15 and preferably at a dose of about 5E15 to about 6E15, and a typical energy level of about 10 to about 15 Kev and preferably an energy level of about 12 to about 13 Kev.

After this implantation, the structure is typically thermally annealed. This thermal anneal is typically carried out at temperatures of about 950–1050° C. for about 5 to about 20 seconds.

The gate sidewall isolation 10 typically comprises a silicon dioxide layer, silicon nitride layer or combinations of these layers.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A thin film silicon-on-insulator semiconductor device comprising:

a layer of semiconductor material;

a buried insulation layer located above the layer of semiconductor material;

a semiconductor SOI layer of a first conductivity type located above the buried insulation layer;

a gate insulating layer located above preselected portions of the semiconductor SOI layer;

a gate conductor located above the gate insulating layer;

source and drain regions of a second conductivity type opposite from the conductivity type of the semiconductor SOI layer; shallow source and drain extensions of the second conductivity type; and a pocket halo implant of indium disposed beneath the gate insulating layer and contacting the gate insulating layer, wherein a portion of the semiconductor SOI layer is disposed between the pocket halo implant and the buried insulation layer such that the pocket halo implant is out of contact with the buried insulation layer and wherein the shallow source and drain extensions extend above a portion of the pocket halo implant and only partly through a thickness of the semiconductor SOI layer in a channel region of the semiconductor SOI layer.

2. The thin film silicon-on-insulator semiconductor device of claim 1 wherein the pocket halo implant is indium implanted at a dosage of about 5E13 to about 1.5E14 at an energy level of about 60 to about 125 Kev.

3. The thin film silicon-on-insulator semiconductor device of claim 1 wherein the device is a SOI MOSFET device.

4. The thin film silicon-on-insulator semiconductor device of claim 1 wherein the semiconductor material is silicon and the semiconductor SOI layer is silicon.

5. The thin film silicon-on-insulator semiconductor device of claim 4 wherein the first conductivity type is a p-type.

6. The thin film silicon-on-insulator semiconductor device of claim 1 wherein the peak active indium concentration is about $8 \times 10^{18}$ atoms/cm$^3$ to about $2 \times 10^{19}$ atoms/cm$^3$.

7. The thin film silicon-on-insulator semiconductor device of claim 1 wherein the buried insulating layer comprises silicon dioxide.

8. The thins film silicon-on-insulator semiconductor device of claim 1 wherein the gate insulating layer comprises silicon dioxide.

9. The thin film silicon-on-insulator semiconductor device of claim 1 wherein the gate conductor comprises polycrystalline silicon.

10. The thin film silicon-on-insulator semiconductor device of claim 1 wherein the device futher includes side wall spacers on the gate conductor.

11. The thin film silicon-on-insulator semiconductor device of claim 10 wherein the side wall spacers comprise silicon dioxide, silicon nitride or combinations thereof.

12. The thin film silicon-on-insulator semiconductor device of claim 1 wherein the dosage of the shallow source and drain extensions is about 6E14 to about 9E14 and the dosage of the source and drain regions is about 3E15 to about 7E15.

13. The thin film silicon-on-insulator semiconductor device of claim 1 wherein the dosage of the shallow source and drain extensions is about 7E14 to about 8E14 and the dosage of the source and drain regions is about 5E15 to about 6E15.

14. The thin film silicon-on-insulator semiconductor device of claim 1, wherein the pocket halo implant is arranged to provide a lower apparent drain-induced barrier lowering.

15. The thin film silicon-on-insulator semiconductor device of claim 1, wherein the pocket halo implant is arranged to provide a charge leakage path from the SOI layer and reduce a floating body effect.

16. The thin film silicon-on-insulator semiconductor device of claim 1, wherein the pocket halo implant is arranged to provide a body-source diode to reduce a floating body effect.

* * * * *